United States Patent
Margulis

(10) Patent No.: US 11,177,775 B2
(45) Date of Patent: Nov. 16, 2021

(54) DETECTION CIRCUIT AND METHOD FOR AMPLIFYING A PHOTOSENSOR OUTPUT CURRENT

(71) Applicant: APPLIED MATERIALS ISRAEL LTD., Rehovot (IL)

(72) Inventor: Pavel Margulis, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 69 days.

(21) Appl. No.: 16/712,475

(22) Filed: Dec. 12, 2019

(65) Prior Publication Data

US 2021/0184634 A1    Jun. 17, 2021

(51) Int. Cl.
*H03F 1/08* (2006.01)
*H03F 1/26* (2006.01)
*H03F 3/20* (2006.01)

(52) U.S. Cl.
CPC ............. *H03F 1/08* (2013.01); *H03F 1/26* (2013.01); *H03F 3/20* (2013.01); *H03F 2200/372* (2013.01)

(58) Field of Classification Search
CPC ..... H03F 1/08; H03F 3/20; H03F 1/26; H03F 2200/372; H03F 3/211; H03F 3/45475; H03F 3/087; H03F 2200/144; G01R 19/0092; G01J 1/44
USPC ........................ 330/124 R, 295, 84, 286, 308
See application file for complete search history.

(56) References Cited

U.S. PATENT DOCUMENTS

| | | | |
|---|---|---|---|
| 4,859,961 A | 8/1989 | Davenport | |
| 6,297,701 B1 | 10/2001 | Visocchi et al. | |
| 6,720,827 B2 | 4/2004 | Yoon | |
| 7,282,689 B2 * | 10/2007 | Zimmerman | ....... H01L 27/1443 250/214 R |
| 8,736,381 B2 | 5/2014 | Chiesi et al. | |
| 10,338,224 B2 | 7/2019 | Eken et al. | |
| 2019/0131942 A1 | 5/2019 | Li et al. | |

OTHER PUBLICATIONS

Linear Technology, LTC6254: 720 MHZ, 3.5mZ Power Efficient Rail-to-Rail I/O Op Amps Data Sheet, https://www.analog.com/en/products/ltc6254.html#product-overview, pp. 1-26, printed Apr. 3, 2020.
Linear Technology, LT1028: Ultralow Noise Precision High Speed Op Amps Datasheet, https://www.analog.com/en/?products/lt1028.html#product-overview, pp. 1-28 pages, printed Apr. 3, 2020.

* cited by examiner

*Primary Examiner* — Hieu P Nguyen
(74) *Attorney, Agent, or Firm* — Kilpatrick Townsend & Stockton LLP

(57) ABSTRACT

A detection circuit that may include (i) a photosensor that is configured to convert light to current; wherein the photosensor has an output node and is configured to operate as a current source, (ii) an adder, and (iii) multiple amplification branches that are coupled in parallel between the adder and the output node of the photosensor. The multiple amplification branches do not share a feedback circuit, wherein all amplification branches of the multiple amplification branches comprise an amplifier of a same type, wherein the type is selected out of a transimpedance amplifier and a current amplifier.

13 Claims, 4 Drawing Sheets

DETECTION CIRCUIT AND METHOD FOR AMPLIFYING A PHOTOSENSOR OUTPUT CURRENT

BACKGROUND OF THE INVENTION

Photosensor, when operating as a current source, are configured to convert light to a photosensor output current.

The photosensor output current may be relatively weak and should be amplified and converted into a voltage signal.

The amplification may require using multiple amplifiers.

Using a detection circuit that includes the photosensor and parallelly coupled transimpedance amplifiers that share a same feedback circuit has been shown to be impractical—as even slight mismatches between the transimpedance amplifiers cause the sensing module to output an output current that did not reflect the photosensor output signal.

Using a detection circuit that includes the photosensor and parallelly coupled voltage amplifiers has been shown to have a very narrow bandwidth due to a very high input resistance of the voltage amplifiers. Using voltage amplifiers of reduced input resistance reduces the noise performance of the voltage amplifiers.

There is a growing need to provide a robust detection circuit that can properly operate even at the presence of mismatches between the amplifiers.

BRIEF SUMMARY OF THE INVENTION

There may be provided a detection circuit and a method for amplifying a photosensor output current.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
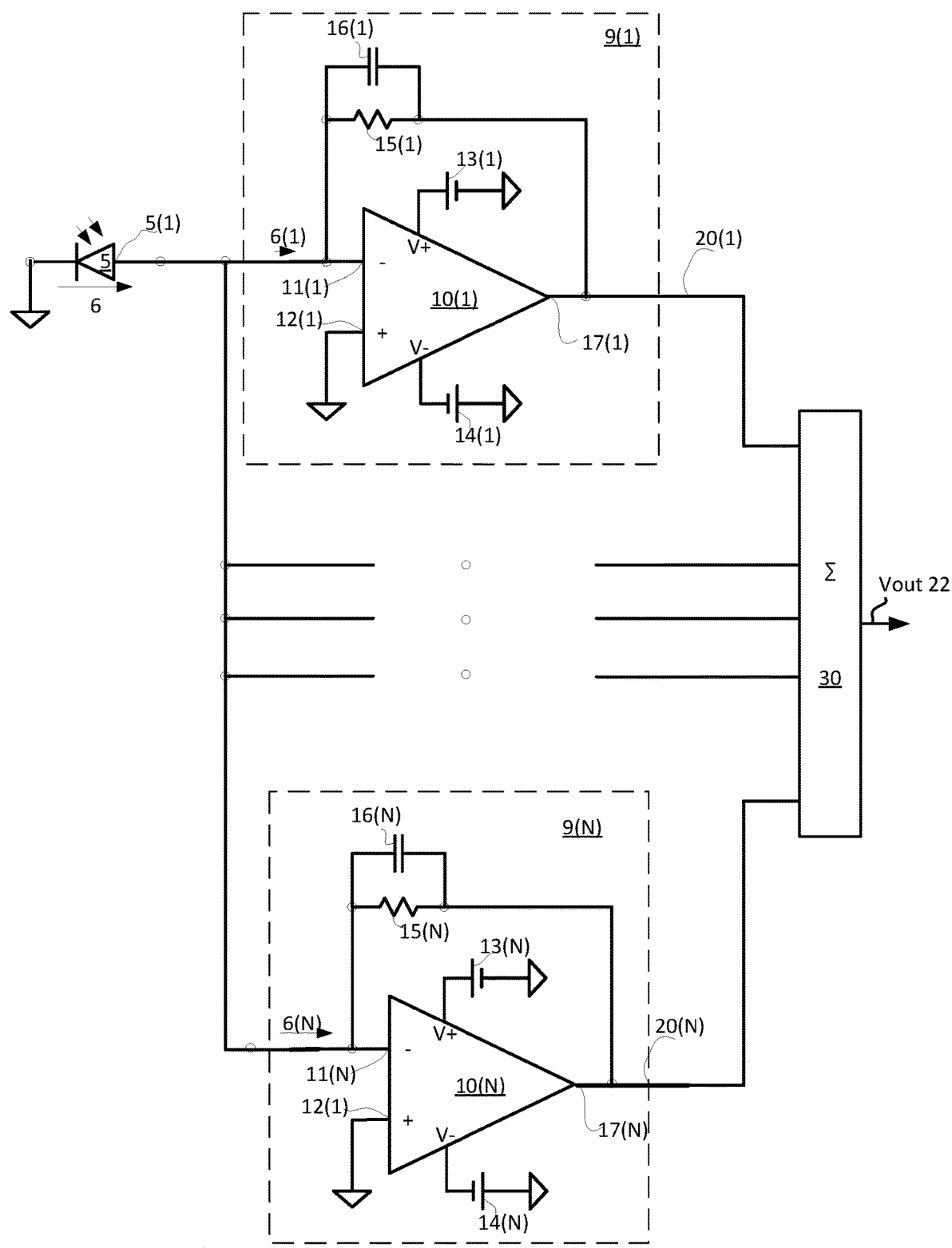
FIG. 1 illustrates an example of a detection circuit.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

There is provided a detection circuit that includes a photosensor that is configured to convert light to current, an adder and multiple amplification branches that do not share a common feedback circuit.

The lack of a common feedback circuit substantially isolates the amplification branched from each other and allows the detection circuit to properly operate even at the presence of mismatches between amplifiers of the amplification branches.

Each amplification branch may include a transimpedance amplifier that includes an operational amplifier and a feedback circuit.

The photosensor output current is split between the amplification branches. Each amplifier converts a fraction of the photosensor output current to an amplification branch output signal.

When the amplifier is a current amplifier then the amplification branch output signal is an amplification branch output current. In this case, the adder is a current adder.

When the amplifier is a transimpedance amplifier then the amplification branch output signal is an amplification branch output voltage. In this case the adder is a voltage adder.

The amplifiers of the different amplification branch are of the same type. For example—all amplifiers may be current amplifiers. Alternatively—all amplifiers may be transimpedance amplifiers.

FIG. 1 illustrates an example of detection circuit 4.

Detection circuit 4 may include a photosensor 5 that is coupled in parallel to multiple (N) amplification branches 9(1)-9(N). N being a positive integer that exceeds one.

The output node 5(1) of the photosensor 5 is coupled in parallel to the inputs of the multiple amplification branches 9(1)-9(N).

The photosensor is configured to operate as a current source.

The photosensor 5 outputs a photosensor output current 6 that is split between the multiple amplification branches—as illustrated by input currents 6(1)-6(N) that are fed to first amplification branch till N'th amplification branches 9(1)-9(N).

In FIG. 1, the multiple amplification branches include transimpedance amplifiers that are formed by operational amplifiers 10(1)-10(N) and their feedback circuits—one feedback circuit per each amplification branch.

The first amplification branch 9(1) includes a first transimpedance amplifier that includes a first feedback circuit and a first operational amplifier 10(1). The first operational amplifier 10(1) has (i) a first input 11(1) that may be virtually grounded and is adapted to receive first input current 6(1), (ii) a grounded second input 12(1), (iii) an output 17(1), and (iv) two ports for receiving supply voltages from first positive supply 13(1) and from first negative supply 14(1).

The first feedback circuit is represented by a first feedback resistor 15(1) and a first feedback capacitor 16(1) that are coupled in parallel to each other and between first input 11(1) and output 17(1) of the first operational amplifier 10(1).

The first amplification branch 9(1) outputs a first output voltage 20(1) that is fed to adder 30.

The N'th amplification branch 9(N) includes a N'th transimpedance amplifier that include N'th feedback circuit and a N'th operational amplifier 10(N). The N'th operational amplifier 10(N) has (i) a first input 11(N) that is virtually grounded and is adapted to receive N'th input current 6(N), (ii) a grounded second input 12(N), (iii) an output 17(N), and (iv) two ports for receiving supply voltages from N'th positive supply 13(N) and from N'th negative supply 14(N).

The N'th feedback circuit is represented by a N'th feedback resistor 15(N) and a N'th feedback capacitor 16(N) that are coupled in parallel to each other, and between first input 11(N) and output 17(N) of the N'th operational amplifier 10(N).

The N'th amplification branch 9(N) outputs a N'th output voltage 20(N) that is fed to adder 30.

All of the multiple amplification branches may have the same configuration.

Each of the feedback circuits may include a resistor and a capacitor, or may consist of the resistor and the capacitor.

A feedback circuit may include other components in different interconnections with a goal of providing required performance and stable operation of transimpedance amplifier. For example, a feedback circuit may include few resistors and few capacitors in different interconnection schemes The output of each of the transimpedance amplifier may be connected to an input of an adder (that is then connected to a resistor of the adder) solely by a conductor—or using a conductor and at least one other electronic component.

Adder 30 is configured to sum (or apply a weighted sum) of the first output voltage till N'th output voltages to provide detection circuit output signal Vout 22.

Adder 30 may also amplify a signal that is a sum of the N output voltages (from the multiple amplification branches) to provide detection circuit output signal Vout 22.

Figure 2:
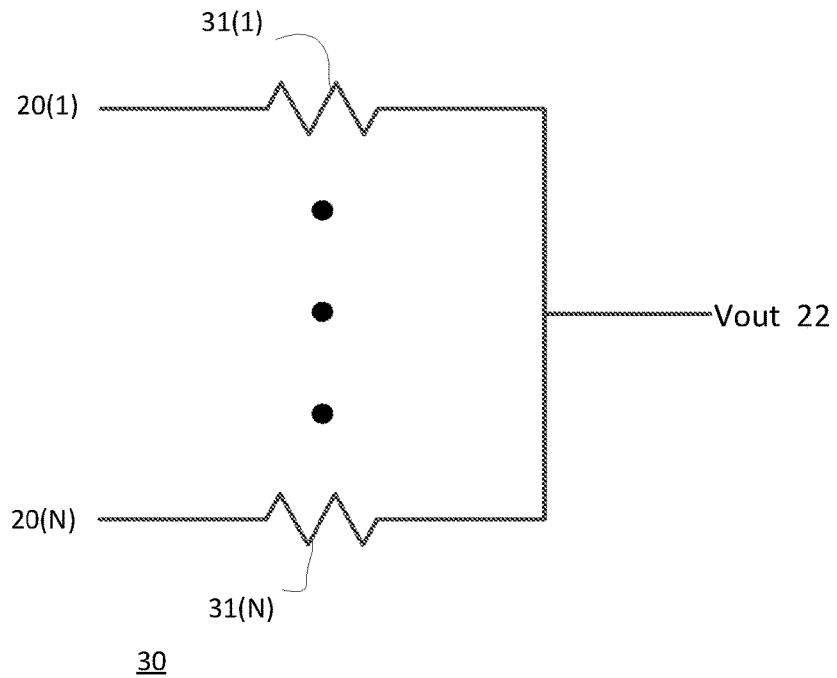
FIG. 2 illustrates an example of a detection circuit.
Figure 2:
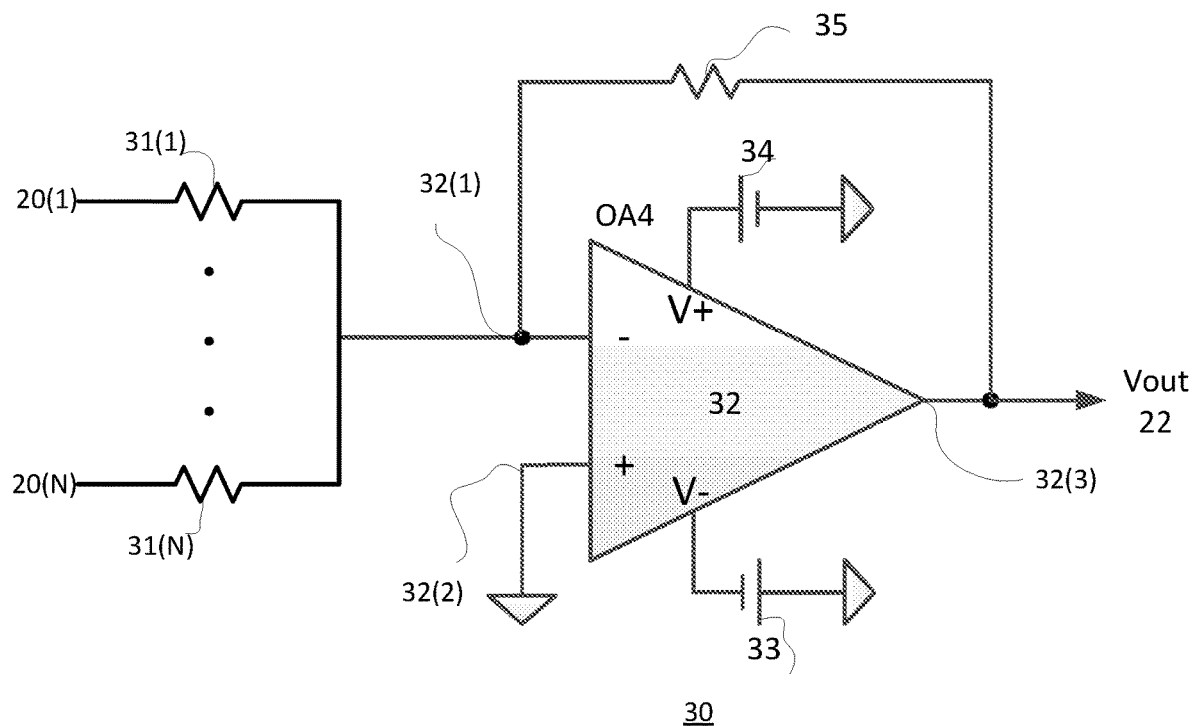

FIG. 2 illustrates two examples of adder 30.

A first example of adder 30 includes multiple (N) resistors 31(1)-31(N) that have their outputs coupled in parallel to each other. Each resistor has an input for receiving an output voltage of a unique amplification branch. For example—first resistor 31(1) receives first output voltage 20(1), and N'th resistor 30(N) receives the N'th output voltage 20(N).

The outputs of the multiple resistors 31(1)-31(N) are connected to each other and output the output voltage 22. When the multiple resistors are equal to each other then output voltage is an average of first till N'th output voltages. Differences in the values of the resistor may be provide an output signal that is a weighted sum.

A second example of adder 30 includes the multiple resistors 31(1)-31(N) that have their outputs coupled in parallel to each other. The outputs of the multiple resistors are connected to an output amplifier such as a transimpedance amplifier that includes a feedback circuit and operational amplifier 32. Operational amplifier 32 may be coupled to a feedback circuit that includes a feedback resistor (Rf) 35.

The operational amplifier 32 has a (i) first input 32(1) that is virtually grounded and is adapted to receive a sum of currents outputted from the multiple resistors 31(1)-31(N), (ii) a grounded second input 32(2), (iii) an output 32(3), and (iv) two ports for receiving supply voltages from positive supply 34, and from negative supply 33.

The virtually grounding of the first input 32(1) improves the isolation between the amplification branches.

Assuming index n that ranges between 1 and N. The output voltage of the n'th branch is denoted Vb(n). For example, Vb(1) is first output voltage 20(1). The resistor of the n'th branch is denoted Rb(n). For example, the Rb(N) is the N'th resistor 3'1(N). The feedback resistor 35 is denoted Rf.

In the configuration of FIG. 2, the output voltage Vout 22 equals a SUM of Vb(n)*Rf/Rb(n)—for n between 1 to N.

Figure 3:
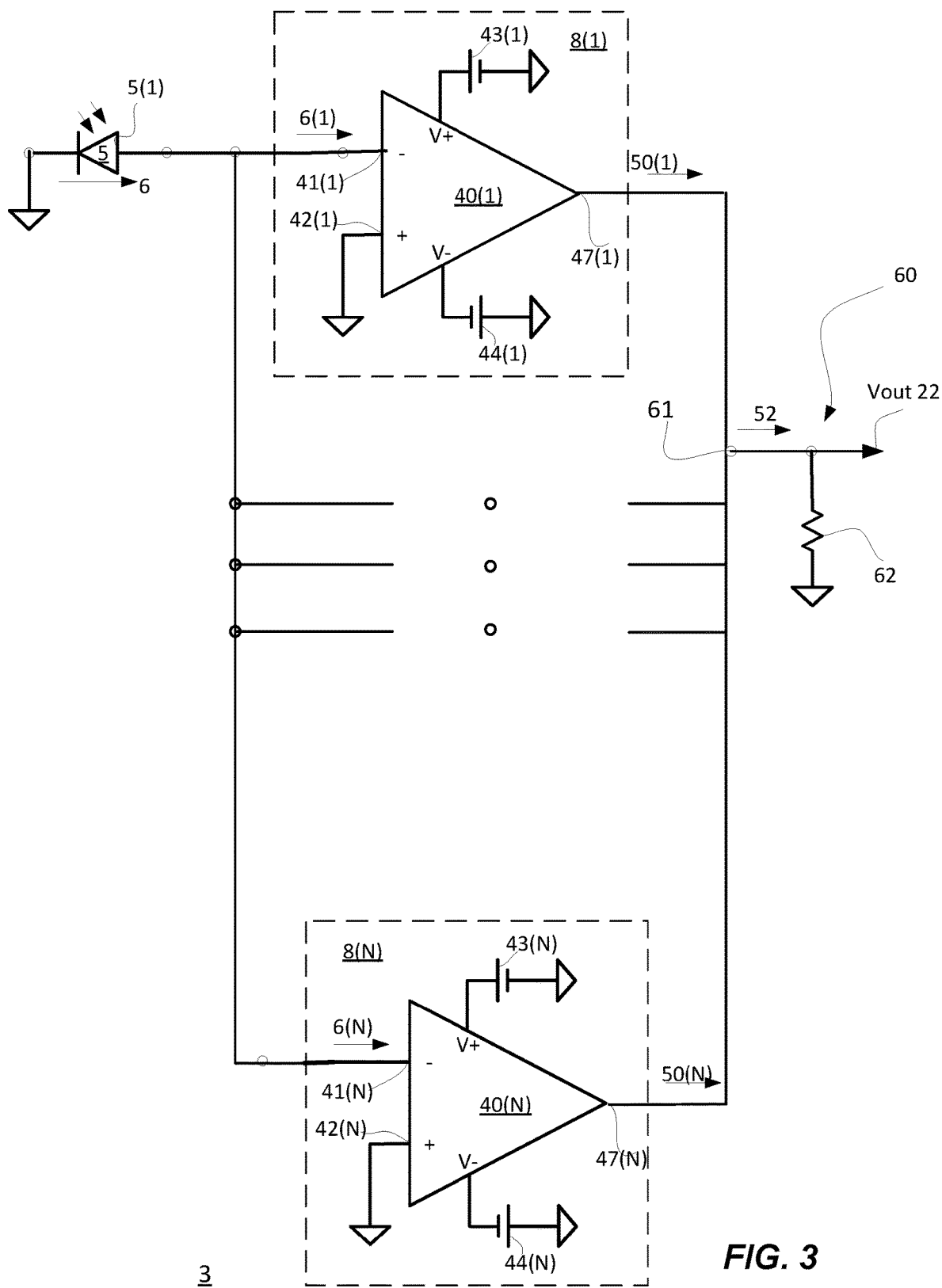
FIG. 3 illustrates an example of a detection circuit.

FIG. 3 illustrates an example of detection circuit 3.

Detection circuit 3 may include a photosensor 5 that is coupled in parallel to multiple (N) amplification branches 8(1)-8(N). N being a positive integer that exceeds one. Especially—the output node 5(1) of the photosensor 5 is coupled in parallel to the inputs of the multiple amplification branches 8(1)-8(N).

The photosensor is configured to operate as a current source.

The photosensor 5 outputs a photosensor output current 6 that is split between the multiple amplification branches—as illustrated by input currents 6(1)-6(N) that are fed to first till N'th amplification branches 8(1)-8(N).

In FIG. 3, the multiple amplification branches include current amplifiers 40(1)-40(N) and are without a feedback circuit.

The first amplification branch 8(1) includes a first current amplifier 40(1) that has (i) a first input 41(1) that has a low input impedance is adapted to receive first input current 6(1), (ii) an output 47(1), and (iii) two ports for receiving supply voltages from first positive supply 43(1) and from first negative supply 44(1). The first current amplifier 40(1) may also include a second input 42(1).

The first current amplifier 40(1) outputs a first output current 50(1) that is fed to adder 60. The adder 60 may include (a) output node 61 that is coupled to the outputs of all amplification branches, and (ii) load resistor 62.

The N'th amplification branch 8(N) includes a N'th current amplifier 40(N) that has (i) a first input 41(N) that has a low input impedance is adapted to receive N'th input current 6(N), (ii) an output 47(N), and (iii) two ports for receiving supply voltages from N'th positive supply 43(N) and from N'th negative supply 44(N). The N'th current amplifier 40(N) may also include a second input 42(N).

The N'th current amplifier 40(N) outputs an N'th output current 50(N) that is fed to an adder 60.

In FIG. 3, the adder 60 includes (a) node 61 to which all outputs of the amplification branches are connected, and (b) load resistor 62 that is configured to convert a sum 52 of all output currents of all the amplification branches to output voltage Vout 22.

It should be noted that the photosensor may be included in a detection circuit. Alternatively, the detection circuit may not include the photosensor—but is merely coupled to the photosensor.

Figure 4:
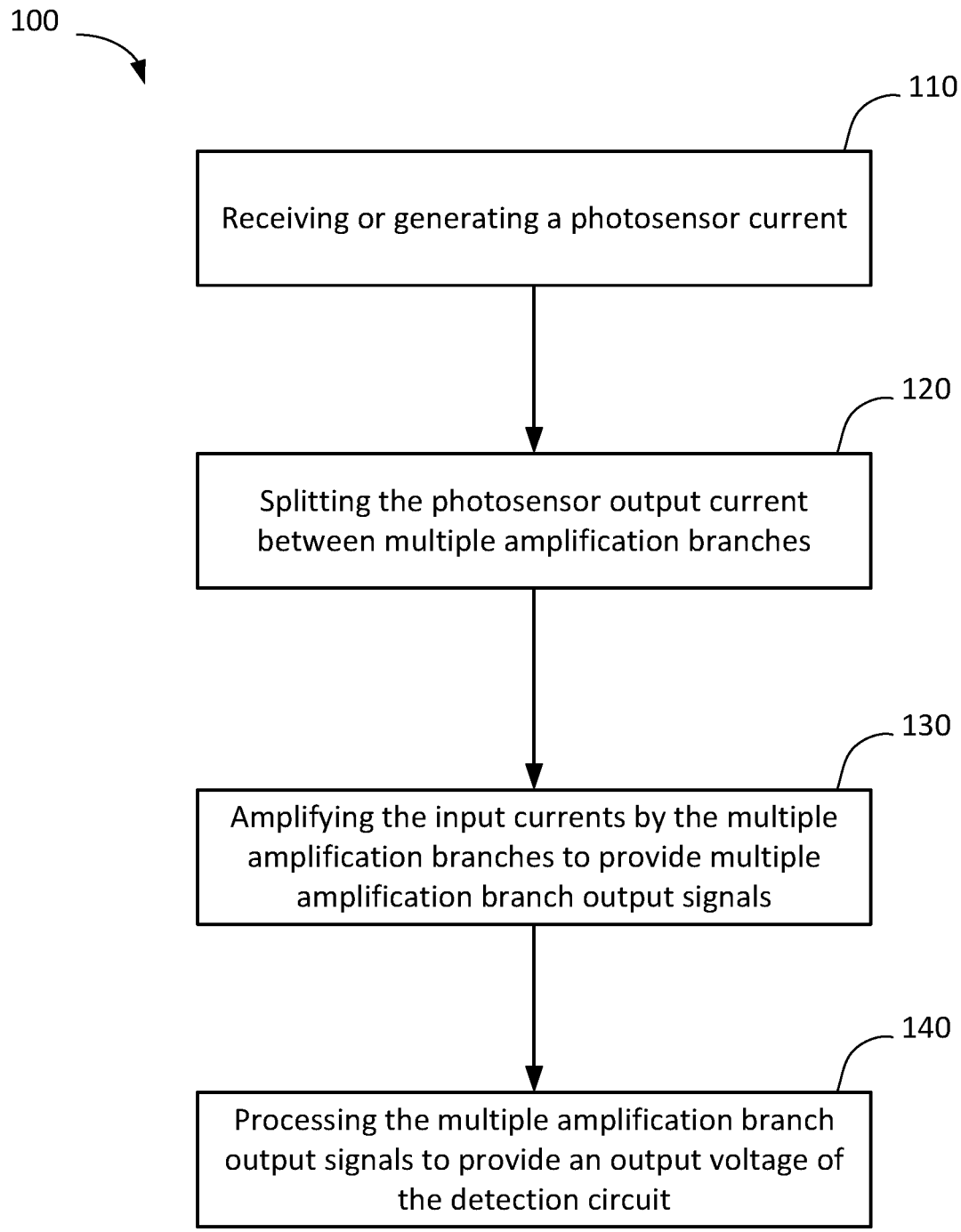
FIG. 4 illustrates an example of a method.

FIG. 4 is an example of a method 100 for amplifying a photosensor output current.

Method 100 may be executed by any of the detection circuits illustrated in the specification.

Method 100 may start by step 110 of receiving or generating a photosensor output current. The generating may include converting light to current by a photosensor that operates as a current source. The current outputted by the photosensor is a photosensor output current.

Step 110 may be followed by step 120 of splitting the photosensor output current between multiple amplification branches. The splitting involves providing an input current that is a fraction of the photosensor output current to each of the multiple amplification branches.

The multiple amplification branches are coupled in parallel between an adder and the output node of the photosensor.

The amplification branches of the multiple amplification branches do not share a feedback circuit.

All amplification branches of the multiple amplification branches include an amplifier of a same type, wherein the type is a transimpedance amplifier or a current amplifier.

Step 120 may be followed by step 130 of amplifying the input currents by the multiple amplification branches to provide multiple amplification branch output signals.

Step 130 may be followed by step 140 of processing the multiple amplification branch output signals to provide an output voltage of the detection circuit.

The processing may be adding the amplification branch output signals, may include preforming another operation such as an amplification, and the like.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A detection circuit, comprising:
a photosensor configured to convert light to a photosensor output current, wherein the photosensor has an output node and is configured to operate as a current source;
an adder; and
multiple amplification branches that are coupled in parallel between the adder and the output node of the photosensor and are configured to amplify fractions of the photosensor output current, wherein the multiple amplification branches do not share a feedback circuit, wherein all amplification branches of the multiple amplification branches comprise an amplifier of a same type, wherein the type is selected out of a transimpedance amplifier and a current amplifier;
wherein at least one amplification branch comprises a feedback circuit coupled to the amplifier of the amplification branch and wherein the feedback circuit consists of a resistor and a capacitor that are coupled between an output port of the amplifier and a first input of the amplifier.

2. The detection circuit according to claim 1 wherein the amplifier is a transimpedance amplifier that comprises an operational amplifier and a feedback circuit.

3. The detection circuit according to claim 2 wherein the adder comprises multiple resistors that are coupled in series to the multiple amplification branches.

4. The detection circuit according to claim 3 wherein outputs of the multiple resistors are coupled to each other at a certain node of the current adder.

5. The detection circuit according to claim 3 wherein the certain node is an output node of the adder.

6. The detection circuit according to claim 3 wherein the certain node is virtually grounded.

7. The detection circuit according to claim 3 wherein the adder comprises an output amplifier; wherein a first input of the output amplifier is coupled to the certain node.

8. The detection circuit according to claim 7 wherein the output amplifier is an amplifier coupled to a feedback circuit.

9. The detection circuit according to claim 7 wherein the first input of the output amplifier is virtually grounded.

10. The detection circuit according to claim 1 wherein the multiple amplification branches have a same input impedance.

11. The detection circuit according to claim 1 wherein an output port the amplifier is connected, only via a conductor, to an input of the adder, wherein the input of the adder is coupled to a resistor of the adder.

12. The detection circuit according to claim 11 wherein the amplifier is a transimpedance amplifier and wherein the adder has a unique resistor for each amplification branch.

13. The detection circuit according to claim 1 wherein the amplifier is a current amplifier and wherein output ports of the current amplifiers are connected to each other at an output node of the detection circuit and a load resistor.

* * * * *